United States Patent
Matsubara et al.

(10) Patent No.: US 10,340,117 B2
(45) Date of Patent: Jul. 2, 2019

(54) ION BEAM DEVICE AND SAMPLE OBSERVATION METHOD

(71) Applicant: HITACHI, LTD., Tokyo (JP)

(72) Inventors: Shinichi Matsubara, Tokyo (JP); Hiroyasu Shichi, Tokyo (JP); Takashi Ohshima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/514,656

(22) PCT Filed: Sep. 29, 2014

(86) PCT No.: PCT/JP2014/075772
§ 371 (c)(1),
(2) Date: Mar. 27, 2017

(87) PCT Pub. No.: WO2016/051441
PCT Pub. Date: Apr. 7, 2016

(65) Prior Publication Data
US 2017/0229284 A1    Aug. 10, 2017

(51) Int. Cl.
*H01J 37/26* (2006.01)
*H01H 37/18* (2006.01)
(Continued)

(52) U.S. Cl.
CPC ............ *H01J 37/26* (2013.01); *H01H 37/18* (2013.01); *H01J 37/08* (2013.01); *H01J 37/16* (2013.01);
(Continued)

(58) Field of Classification Search
CPC ........... H01J 37/26; H01J 37/28; H01J 37/301
See application file for complete search history.

(56) References Cited

U.S. PATENT DOCUMENTS

| | | |
|---|---|---|
| 5,828,064 A | 10/1998 | Knowles |
| 2009/0173888 A1 | 7/2009 | Shichi et al. |

(Continued)

FOREIGN PATENT DOCUMENTS

| | | |
|---|---|---|
| JP | 62-96255 U | 6/1987 |
| JP | 06-236744 A | 8/1994 |

(Continued)

OTHER PUBLICATIONS

Fu et al. 'Investigation of aspect ratio of hole drilling from micro to nanscale via focused ion beam fine milling' 2005 In: Innovation in manufacturing systems and tech IMST) vol. 01.*

(Continued)

*Primary Examiner* — Eliza W Osenbaugh-Stewart
(74) *Attorney, Agent, or Firm* — Mattingly & Malur, PC (57) ABSTRACT

Since a diffraction phenomenon occurs in the electron beam passing through a differential evacuation hole, an electron beam whose probe diameter is narrowed cannot pass through a hole having an aspect ratio of a predetermined value or more, and accordingly, a degree in vacuum on the electron beam side cannot be improved. By providing a differential evacuation hole with a high aspect ratio in an ion beam device, it becomes possible to obtain an observed image on a sample surface, with the sample being placed under the atmospheric pressure or a pressure similar thereto, in a state where the degree of vacuum on the ion beam side is stabilized. Moreover, by processing the differential evacuation hole by using an ion beam each time it is applied, both a normal image observation with high resolution and an image observation under atmospheric pressure or a pressure similar thereto can be carried out.

6 Claims, 6 Drawing Sheets

(51) Int. Cl.
*H01J 37/28* (2006.01)
*H01J 37/08* (2006.01)
*H01J 37/16* (2006.01)
*H01J 37/18* (2006.01)

(52) U.S. Cl.
CPC .............. *H01J 37/18* (2013.01); *H01J 37/28* (2013.01); *H01J 2237/0807* (2013.01); *H01J 2237/2003* (2013.01); *H01J 2237/2448* (2013.01); *H01J 2237/2449* (2013.01); *H01J 2237/2608* (2013.01); *H01J 2237/31749* (2013.01)

(56) References Cited

U.S. PATENT DOCUMENTS

2009/0321634 A1* 12/2009 Khursheed .............. H01J 37/05
250/307

2013/0317130 A1* 11/2013 Brassard ............... B29C 43/021
521/146
2014/0220244 A1* 8/2014 Mane ................ C23C 16/45565
427/209
2015/0008342 A1* 1/2015 Notte, IV ................ H01J 37/08
250/492.3

FOREIGN PATENT DOCUMENTS

| JP | 2002-516018 A | 5/2002 |
| JP | 2006-147430 A | 6/2006 |
| JP | 2009-142871 A | 7/2009 |
| JP | 2009-163981 A | 7/2009 |
| JP | 2014-075520 A | 4/2014 |

OTHER PUBLICATIONS

International Search Report of PCT/JP2014/075772 dated Nov. 18, 2014.

* cited by examiner

ION BEAM DEVICE AND SAMPLE OBSERVATION METHOD

TECHNICAL FIELD

The present invention relates to an ion beam device and a sample observation method.

BACKGROUND ART

A microstructure of a sample surface can be observed by irradiating a sample with electrons while scanning and by detecting secondary electron charged particles discharged from the sample. This device is referred to as "Scanning Electron Microscope" (hereinafter, referred to simply as SEM).

It has been widely known that the SEM makes it possible to obtain an observed image more easily with higher throughput in comparison with other techniques for observing a microstructure of the surface, such as, for example, an atomic force microscope or a scanning tunnel microscope. In general, an electron source for discharging electrons to be used for the SEM needs to be kept in an ultrahigh vacuum state for stabilization, and for this reason, a sample chamber for holding the sample in irradiating the sample is normally kept in a vacuum state.

For this reason, it is difficult to observe a sample whose nature changes when maintained in vacuum (for example, a biological sample and an organic sample). If a degree of vacuum is lowered in an attempt to observe such a sample, gaseous molecules undesirably flow into the electron source side through a passage (pore) for use in allowing an electron beam discharged from the electron source to pass into the sample chamber. As a result, the degree of vacuum on the electron source side is undesirably lowered.

Therefore, conventionally, as typically represented by an observation inspection for a semiconductor, the application of the SEM has been limited to a sample whose nature is not changed so much even under vacuum.

Meanwhile, along with recent increasing needs for observation of a sample surface in medical and biological fields, devices referred to as an environmental SEM and a low atmospheric pressure SEM or an atmospheric pressure SEM, have become more important.

These devices need to have a reduced vacuum conductance in a passage for allowing an electron beam to reach the sample chamber so as to make the sample chamber set to the atmospheric pressure or a pressure similar thereto, while the electron source is being kept in an ultrahigh vacuum state.

For example, Patent Document 1 discloses a device in which minute orifices with electron permeable membranes (for example, collodion membranes) are provided in a vacuum housing and differential evacuation is carried out. Moreover, an example for an electron microscope which scans a sample by moving a movable stage in place of scanning an electron beam has been described.

RELATED ART DOCUMENTS

Patent Documents

Patent Document 1: Japanese Patent Application Laid-Open Publication No. 2006-147430
Patent Document 2: Japanese Patent Application Laid-Open Publication No. H6-236744
Patent Document 3: National Publication of International Patent Application No. 2002-516018

SUMMARY OF THE INVENTION

Problems to be Solved by the Invention

However, for an SEM which separates the sample chamber and the electron source from each other by using a special thin film (that is, the configuration of the electron microscope described in Patent Document 1), problems of degradation in resolution due to scattering of the primary electron beam in passing through the thin film and durability of the thin film are raised in comparison with a general SEM having the sample chamber kept in high vacuum. Moreover, in an attempt to observe a sample with higher resolution, another SEM needs to be separately purchased, thereby causing problems with high costs.

Meanwhile, one or more holes for limiting conductance, that is, differential evacuation holes are provided in a passage, so that it is theoretically possible to generate a pressure difference between the sample chamber and the electron source. However, as a result of examination by the inventors of the present application, it is found that, since a diffraction phenomenon occurs in the electron beam due to the differential evacuation holes, another problem is raised in that an electron beam whose probe diameter is narrowed cannot pass through a hole having an aspect ratio of a predetermined value or more.

The inventors further examined the above-mentioned problems. As a result, they found that, when an ion beam is used, it becomes possible to increase the aspect ratio of the differential evacuation hole in comparison with the use of the electron beam. As a specific aspect ratio, the differential evacuation hole having an aspect ratio of 200 or more, or 400 or more, is proposed.

When the differential evacuation is carried out by using a hole with such a high aspect ratio, the pressure difference between the sample chamber and the ion source can be made greater in comparison with the use of the differential evacuation hole with a low aspect ratio, so that the pressure in the sample chamber can be increased. As described above, in the case of the electron beam whose probe diameter is narrowed and the device using the same, the beam is not allowed to pass through a hole having such a high aspect ratio, and accordingly, the application thereof has not been assumed.

For example, Patent Document 2 discloses an example in which an electron microscope having a vacuum chamber and a sample chamber that are made adjacent to each other with a pressure control aperture interposed therebetween is provided with a thin pipe forming an electron beam passage between the pressure limiting aperture and a position right above the sample.

However, this thin pipe (17) is used for reducing the scattering of the primary electron beam and for absorbing excessive positive ions staying on the sample so as to prevent the sample from being positively charged. That is, when the distance from the sample to a main surface of an objective lens is long like Patent Document 2, since, in general, influences of lens aberrations become greater to cause deterioration in resolution, it is assumed that such a configuration is required.

Moreover, Patent Document 3 discloses an example of an electron microscope in which four vacuum zones differentially sucked are included so as to provide a pressure difference up to about 10 Torr between a field emission gun and a sample, a differentially pumped system further includes at least four pressure limiting apertures for defining the vacuum zones differentially sucked, and one of the pressure limiting apertures is formed of a pressure limiting aperture assembly having a plurality of stacked annular apertures. Thus, by disposing a plurality of differential evacuation holes through which the electron beam is allowed to pass and providing an intermediate chamber between the electron source and the sample chamber, the pressure difference between the electron source and the sample chamber can be made greater.

However, other problems such as cost increases caused by providing the intermediate chamber itself and by newly providing a vacuum evacuation unit for evacuating the intermediate chamber are raised. Moreover, since a degree of vacuum in the intermediate chamber is set to an intermediate pressure between the sample chamber and the electron source, the electron beam is scattered by gas molecules present in the intermediate chamber to cause deterioration in resolution, in some cases, and therefore, this method fails to provide an essential solution.

Means for Solving the Problems

In order to solve the above-mentioned problem, an ion beam device according to the present invention includes an ion source generating an ion beam, a vacuum chamber in which the ion source is disposed, an evacuation part reducing a pressure in the vacuum chamber, and a sample chamber in which a sample that is irradiated with the ion beam under a second degree of vacuum lower than a first degree of vacuum in which the pressure has been reduced, and the ion beam passes from the vacuum chamber to the sample chamber, and in a passage through which the first degree of vacuum changes to the second degree of vacuum, a hole having an aspect ratio of 200 or more is formed.

In addition, in order to solve the above-mentioned problem, a sample observation method according to the present invention includes the steps of sealing an observation sample in a container, introducing the observation sample that is sealed in the container into a sample chamber, processing a part of the container and forming a hole, irradiating the observation sample with an ion beam through the hole that has been formed, and detecting charged particles derived from the observation sample.

Effects of the Invention

By having the above-mentioned configuration, the present invention makes it possible to reduce deterioration of an irradiation beam caused by passing through a thin film or a region having a low degree of vacuum.

DETAILED DESCRIPTION OF PREFERRED EMBODIMENTS

In an SIM, by irradiating a sample with an ion beam discharged from an ion source while scanning, secondary charged particles discharged from the sample are detected, and a structure of a sample surface is observed. Note that, in the SIM, the ion source has to be kept in an ultrahigh vacuum state for stabilization of the ion source.

Moreover, as a premise, an electron (or ion) beam applied onto the sample has a predetermined opening angle. The opening angle refers to an angle made by viewing an objective lens from a point at which the electron beam is converged on a sample. It is not possible to allow the beam to pass through a hole having an aspect ratio corresponding to the opening angle of the beam or more. Moreover, an optimal opening angle for narrowing the beam changes depending on conditions such as kinds of a converging lens and the objective lens, their geometric positions, the position of the light source, or the position of the sample; however, basically, when the opening angle is made larger, a spherical aberration and a color aberration of the lens increase, and when the opening angle is made smaller, a diffraction aberration increases. Appropriate conditions of the irradiation beam are determined by the balance of these.

The present inventors have found that, since the ion beam is less susceptible to influences by the diffraction aberration in comparison with the electron beam that is accelerated at the same voltage, the ion beam generally has a smaller optimal opening angle than the electron beam and is desirably used for allowing the beam to pass through a differential evacuation hole having a high aspect ratio.

When this idea is taken into consideration, for the differential evacuation hole that limits the vacuum conductance in a passage through which the irradiation beam passes, it is possible that the smaller the diameter, or the longer the length of the hole, that is, the greater the aspect ratio obtained by dividing the length of the hole by the diameter thereof, the greater the differential pressure between the pressure on the sample chamber side and that of the electron source side becomes.

Moreover, as a further effect, as a diameter of the differential evacuation hole is made smaller, it becomes possible to make a length of the differential evacuation hole shorter and consequently, to make the distance between the above-mentioned objective lens and the sample smaller. Thus, the distance from the main surface of the objective lens can be made shorter, and the influences by the lens aberration can be reduced, thereby making it possible to improve the resolution.

Figure 1:
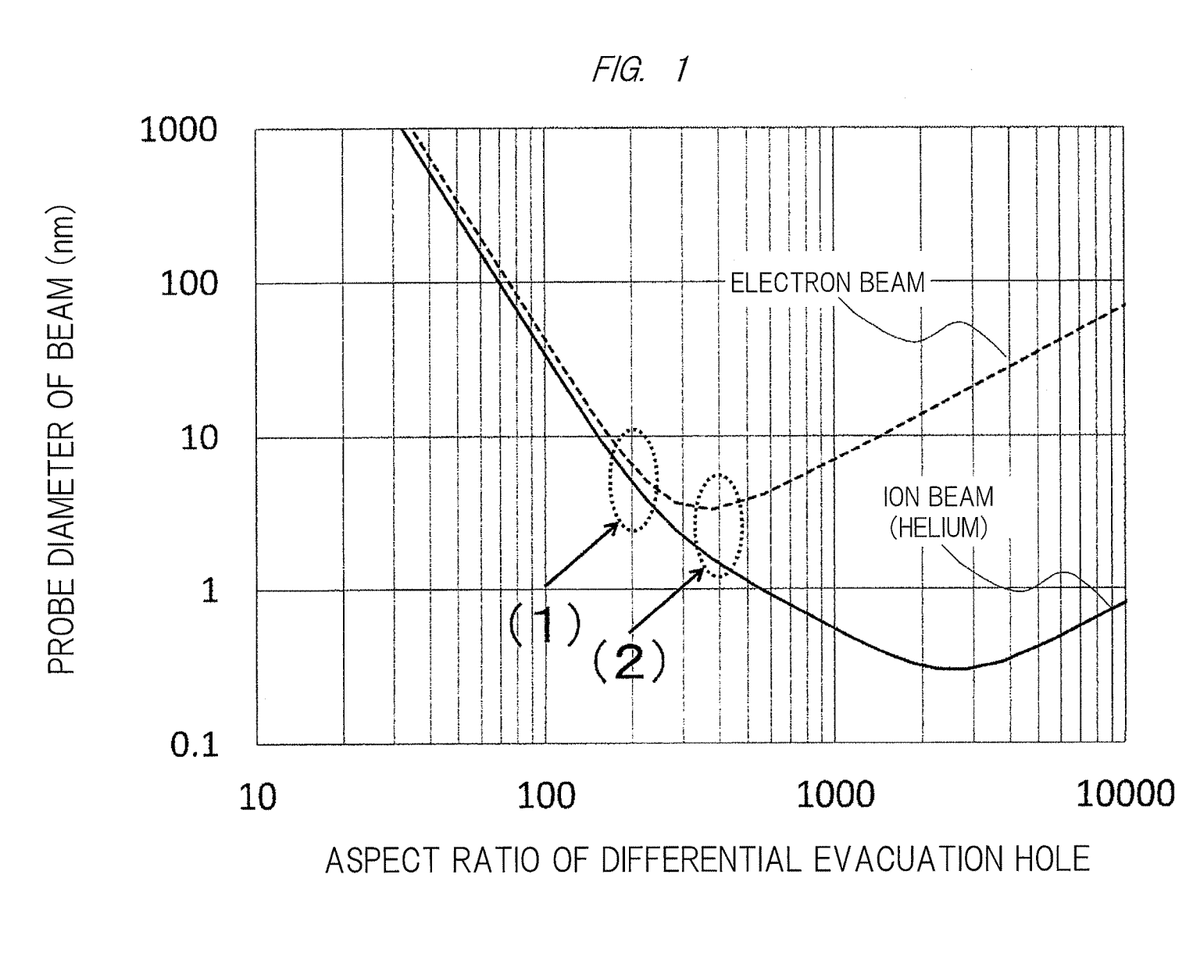
FIG. 1 is a graph illustrating an example in which probe diameters of an electron beam and an ion beam are compared with each other.

Next, FIG. 1 shows results of calculations of probe diameters for each of an electron beam and an ion beam having the opening angle corresponding to a differential evacuation hole having a certain aspect ratio, in a case in which the same electromagnetic lens system is used under the same acceleration condition. In this example, it is found that, at an aspect ratio of 200 or more indicated by an arrow (1), a helium ion beam starts to become more advantageous in resolution. Moreover, at an aspect ratio of 400 or more indicated by an arrow (2), a remarkable difference appears in probe diameter between the electron beam and the ion beam. It is also found that, in the vicinity of the aspect ratio of 300 to 400, the electron beam has its probe diameter no longer reduced and in contrast, its diameter is increased due to diffraction aberration. In the present example, helium is used as a gaseous species of the ion beam.

From only the viewpoint of the differential pressure of differential evacuation, a region having the aspect ratio of 400 or more where the difference in probe diameter appears remarkably even within this range is more advantageous. However, when the probe diameter is narrowed by making the opening angle smaller, the probe current also becomes smaller accordingly. Therefore, in a case in which more importance is put on a signal noise ratio of an observed image, by taking not only the probe diameter, but also the probe current into consideration, a region having an aspect ratio exceeding 200 may be used. Consequently, even a region having an aspect ratio of less than 400 also serves as a useful region in practical use.

It can be said that the hole having the aspect ratio described above is suitably used as the differential evacuation hole; however, the present invention is not limited to this. In particular, such a hole having an aspect ratio restricted by a degree (1) in which the electron beam is not allowed to pass due to the diffraction effect, and (2) in which the ion beam is allowed to pass, that is, an aspect ratio restricted by the diameter and the height satisfying (1) and (2), can be considered to be a shape included in the lowest limit of a scope of the technical idea of the present application.

Moreover, for an ion beam for use in processing a sample and other regions, and for an ion beam for use in observing a sample, it is not necessarily required to use the same ion source, and a gaseous species may be also switched.

In particular, when such an ion source of a field ionization type is used as the ion source for discharging an ion beam, the ion beams can be easily switched by simply switching ionized gases to be introduced into the ion source. Moreover, a gaseous species to be ionized is not limited to helium, but includes hydrogen, argon, or the like, as long as it is a gaseous species capable of exerting a characteristic (high resolution) of the ion beam. Furthermore, it is also effective to use different gaseous species, depending on the usages of the ion beam such as processing and observation.

According to the present invention, it becomes possible to carry out an observation of a sample under the atmospheric pressure or a pressure similar thereto, without causing deterioration in stability of the ion beam. Moreover, it also becomes possible to carry out an observation of a sample with high resolution and an observation under the atmospheric pressure or a pressure similar thereto by using the same device.

By the way, it is impossible to use a method of shutting off the sample chamber and the ion source in vacuum by using a thin film described in Patent Document 1, in place of the hole with a high aspect ratio in the present invention. This is because, since the ion beam generally has a greater characteristic for processing a substance to be irradiated by sputtering in comparison with the electron beam, the thin film is sometimes subjected to processing action.

By paying attention to the characteristic of the ion beam for processing a substance, reversely, the inventors have found that it is possible to configure a charged particle microscope having high usability capable of observing a sample with high resolution and also observing the sample under the atmospheric pressure or a pressure similar thereto, by using the same device.

More specifically, a container in which a sample to be observed under the atmospheric pressure or a pressure similar thereto is sealed is introduced into a sample chamber of a scanning ion microscope device, and after forming a differential evacuation hole on an upper surface of the container by irradiating it with an ion beam, the ion beam is allowed to pass through the differential evacuation hole so as to observe the sample. In accordance with this method, in an attempt to carry out a normal observation, the sample is discharged together with the container from the sample chamber, and by newly introducing a sample thereinto, an observation with high resolution can be carried out without the necessity of preparing another device.

Moreover, it is needless to say that, although the aspect ratio shown in the present invention is defined by the diameter and the height, even in a case in which a diameter in the middle is changed by the height (that is, the hole is not an ideal column shape), the present invention can be applied. When such a hole as to solve the above-mentioned problems is formed and when the hole functions as a hole having a substantially high aspect ratio, it can be determined that the resulting hole belongs to a scope of the present invention.

Figure 2:
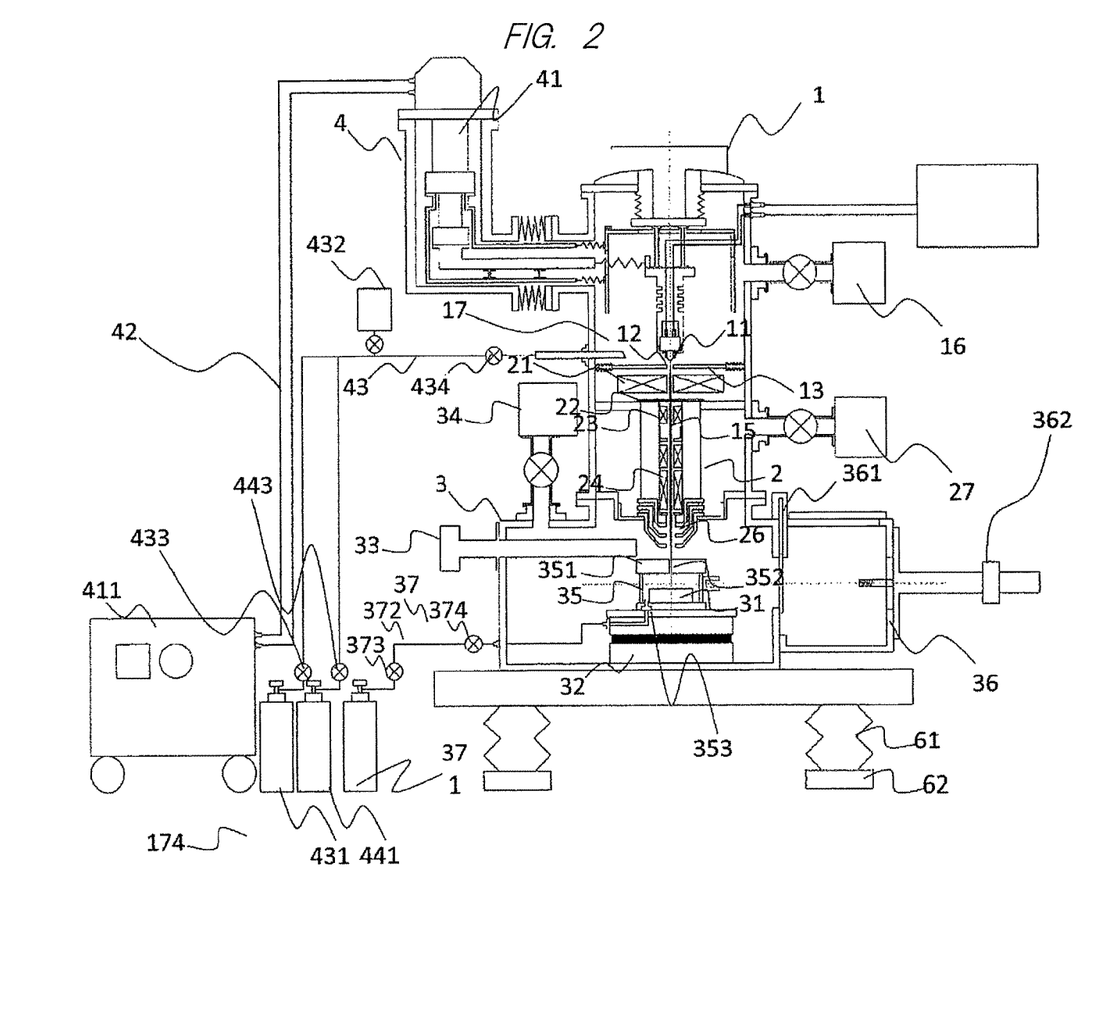
FIG. 2 is a view illustrating an entire image of an ion beam device.

Referring to FIG. 2, an example of a charged particle beam device in accordance with the present invention will be described. Hereinbelow, a first example of a scanning ion microscope device will be described as an ion beam device. The scanning ion microscope of the present example is provided with a gas field ionization ion source 1, an ion beam irradiation system column 2, a sample chamber 3, and a cooling mechanism 4. In this case, the gas field ionization ion source 1, the ion beam irradiation system column 2, the sample chamber 3, and the cooling mechanism 4 are contained in the vacuum container.

The gas field ionization ion source 1 includes a needle-shaped emitter tip 11, and an extraction electrode 13 that is disposed so as to be opposed to the emitter tip 11 and provided with an opening 12 through which ions pass. A space including the emitter tip 11, that is, an ionization chamber 17, is evacuated by a vacuum pump 16 so as to be in a vacuum state.

In the present example, an ionization chamber outer wall is configured so as to be commonly used as an outer wall of the vacuum container; however, it is possible to configure such that the ionization chamber outer wall is separately provided to have the ionization chamber 17 contained in the vacuum container. The beam irradiation system column 2 is constituted by a converging lens 21 converging ions discharged from the gas field ionization ion source 1, a movable aperture 22 limiting an ion beam 15 that has passed through the converging lens 21, a first deflector 23 scanning or aligning the ion beam 15 that has passed through the aperture 22, a second deflector 24 deflecting an ion beam 15 that has passed through the aperture 22, and an objective lens 26 converging the ion beam 15 that has passed through the aperture 22 on a sample 31. The inner space of the beam irradiation system column 2 is evacuated by a vacuum pump 27.

Moreover, inside the sample chamber 3, a sample stage 32 on which a vacuum container 35 containing the sample 31 is mounted is provided. The sample chamber 3 is evacuated by a vacuum pump 34 to be in a vacuum state. The ion beam 15 from the gas field ionization ion source 1 reaches the sample chamber 3 by way of the ion beam irradiation system column 2. The ion beam 15 is irradiated onto the sample 31 through a differential evacuation hole 352 formed in a partition wall 351 at an upper portion of the vacuum container 35. Secondary particles from the sample 31 irradiated with the ion beam 15 are detected by a secondary particle detector 33.

Prior to being introduced into the sample chamber 3, the sample 31 is sealed in the vacuum container 35. At this time, it may be configured such that the partition wall 351 is removed, a sample is placed, and thereafter, the sample 31 is sealed by using the partition wall 351 again. Moreover, in sealing, after the vacuum container 35 has been filled with a predetermined gas so as to observe the sample 31 under the atmospheric pressure or a pressure similar thereto, the container 35 containing the sample 31 maybe introduced into the sample chamber 3.

When the vacuum container 35 containing the sample 31 is introduced into the sample chamber 3, it is once introduced into a sample preparation chamber 36. Thereafter, the sample preparation chamber 36 is evacuated by a vacuum pump not shown to be in a vacuum state. At this time, a connection hole 353 is closed such that the gas filled inside the vacuum container 35 is not evacuated. After the sample preparation chamber 36 has been sufficiently evacuated to be in a vacuum state, a gate valve 361 is opened, and by using a linear introducing machine 362, the vacuum container 35 containing the sample 31 is introduced into the sample chamber 3.

A gas introducing mechanism 37 may be provided so as to introduce a predetermined gas later into the vacuum container 35, after the vacuum container 35 containing the sample 31 has been introduced. By evacuating the sample chamber 3 to be in a vacuum state after the differential evacuation hole 352 has been processed, the inside of the vacuum container 35 is also evacuated to be in a vacuum state through the differential evacuation hole 352, so that the pressure inside the container 35 is lowered. By using the gas introducing mechanism 37, it is possible to constantly observe the state of the sample under a fixed pressure. The gas introducing mechanism 37 is provided with a gas cylinder 371, a gas line 372, a valve 373 and a flow rate adjusting unit 374.

In accordance with an evacuation conductance of the differential evacuation hole 352 processed by the ion beam and an evacuation speed of the vacuum pump 34, a speed at which the gas inside the container is evacuated is varied. A gas flow rate may be adjusted so as to set a sample atmosphere to a fixed pressure by using the flow rate adjusting unit 374. The gas line 372 may be configured so as to be connected to the connection hole 353 of the vacuum container 35 through the sample stage 32. By configuring the gas line 372 and the connection hole 353 of the vacuum container 35 so as to be connected to each other in vacuum, simultaneously as the vacuum container 35 is mounted on the sample stage 32, when the sample 31 and the vacuum container 35 are exchanged so as to observe another sample, the corresponding work can be easily carried out.

The cooling mechanism 4 cools the inside of the field ionization ion source 1, the emitter tip 11, the extraction electrode 12, the ionization chamber, or the like. The cooling mechanism 4 is prepared by using, for example, a cooler of Gifford-McMahon type (GM type), a pulse tube type, or the like, or by using a refrigerant such as liquid helium, liquid nitrogen, or solid nitrogen. Moreover, by circulating or introducing a gas cooled by the above-mentioned cooler or refrigerant, a cooling power may be transmitted from a cooler separated from the device main body to the device.

Moreover, the differential evacuation hole 352 of the partition wall 351 may be also formed later by processing it by the ion beam. By preparing the material of the partition wall 351 as such a material as to transmit light, a surface state of the sample 31 sealed inside the container 35 can be observed from the upper surface. For example, by checking the surface with an optical microscope, a portion at which the differential evacuation hole 352 is processed may be determined. The optical microscope for use in the above-mentioned application may be provided in the sample chamber 3, although the illustration thereof is omitted.

Furthermore, with respect to the ion beam for processing the upper surface of the container and the ion beam for use in observing the sample, it is not necessarily required to use the same ion beam, and these beams can be switched. When such an ion source of a field ionization type is used as the ion source discharging an ion beam, the ion beams can be easily switched by simply switching ionization gases to be introduced into the ion source.

The ionization gas to be introduced into the gas field ionization ion source 1 is supplied to the vicinity of the emitter tip 11 from a gas cylinder 431 through a gas line 43. A gas pressure is adjusted by using a flow rate adjusting unit 434 provided in the gas line 43. In switching the kinds of ion beams to be discharged from the gas field ionization ion source 1, the supply of the ionization gas from the gas cylinder 431 is stopped, and supply of an ionization gas from a different second gas cylinder 441 is started. The different ionization gas is supplied to the vicinity of the emitter tip 11 from the gas cylinder 441 through the gas line 43. A gas pressure is adjusted by using the flow rate adjusting unit 434 provided in the gas line 43. In switching to a further different ion beam, a different gas may be introduced into the gas field ionization ion source by using the same configuration not shown.

Moreover, the gas line 43 may be configured so as to be evacuated to be in a vacuum state by a vacuum pump 432. Prior to the ionization gas introduction, or at the time of switching the ionization gas, by carrying out a preliminary evacuation of the gas line 43, purity of the ionization gas can be raised.

Moreover, an aspect ratio of the differential evacuation hole 352 may be designed so as to be 200 or more, or 400 or more. As the aspect ratio becomes greater, difference in degree of vacuum between the vacuum container 35 and the sample chamber 3 or the ion source 1 becomes greater; however, an opening angle of a beam capable of passing through the hole having the above-mentioned aspect ratio is smaller than the optimal opening angle in the electron beam. In the case of the ion beam, it becomes possible that the ion beam passes through even the hole having the above-mentioned aspect ratio without sacrificing its resolution.

A visual field of an observed image is sometimes limited by the diameter of the differential evacuation hole 352; however, depending on the visual field of the observed image required, the thickness of the partition wall 351 may be changed. Even in the case of holes having the same aspect ratio, by changing the length, the diameter of the hole is changed. In a case in which a larger visual field of an observed image is required, the thickness of the partition wall 351 is increased. In comparison with a case having a small thickness, the processing time for the differential evacuation hole 352 by the ion beam 15 becomes longer; however, by increasing the diameter of the differential evacuation hole 352 correspondingly even having the same aspect ratio, the visual field of the observed image can be consequently expanded.

Figure 3:
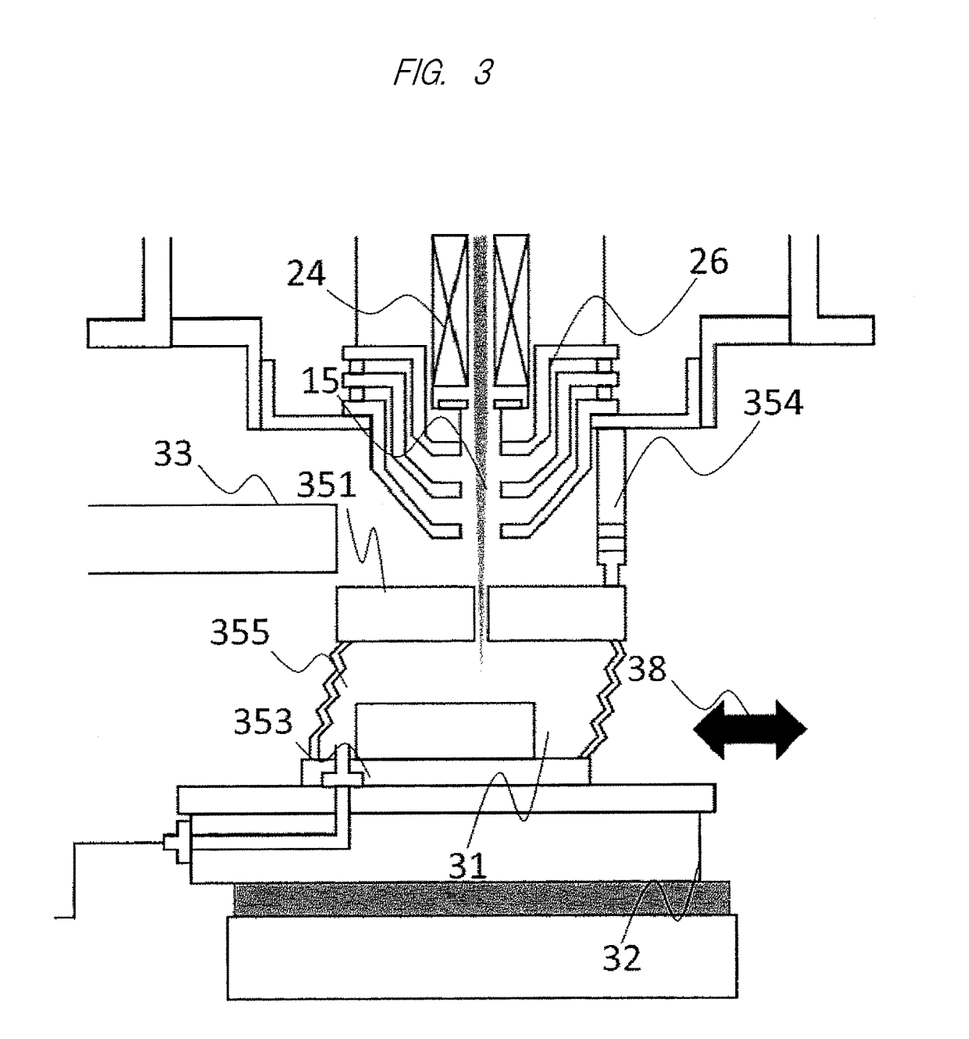
FIG. 3 is a view illustrating positional movements in a sample chamber in the ion beam device.

FIG. 3 is an enlarged view illustrating a vacuum chamber of the ion beam device and its vicinity. As shown in FIG. 3, in an attempt to expand a visual field of an observed image, with the diameter of the differential evacuation hole 352 being kept small, the sample chamber 3 and the vacuum container 35 whose relative positions are movable can be configured, as illustrated. In this case, a movement control unit controlling the relative positions is provided. After processing the differential evacuation hole 352 in the partition wall 351 by using the ion beam 15, the partition wall 351 and the differential evacuation hole 352 are fixed relative to the ion beam 15, that is, relative to the gas field ionization ion source 1 and the beam irradiation system column, by using a partition wall fixing mechanism 354, and by moving the sample 31 to perform scanning (arrow 38), the relative positions between the irradiation point of the ion beam, and sample observation and processing positions can be moved. Thus, an observed image is obtained by detecting charged particles derived from the sample, so that it is possible to expand the visual field of the observed image irrespective of the size of the diameter of the differential evacuation hole 352.

In order to scan the sample 31, with the partition wall 351 being fixed, a side wall of the container 35 may be constituted by a member 355 that is movable, as shown in FIG. 3. As a specific example for the movable member 355, for example, a bellows made of metal is proposed. Moreover, as shown in FIG. 4, by sliding a lower portion of the vacuum container on a vacuum sealing surface 358 disposed between the partition wall 351 and the lower portion of the vacuum container, the scanning may be performed, with the inside thereof being kept in an airtight state.

Figure 4:
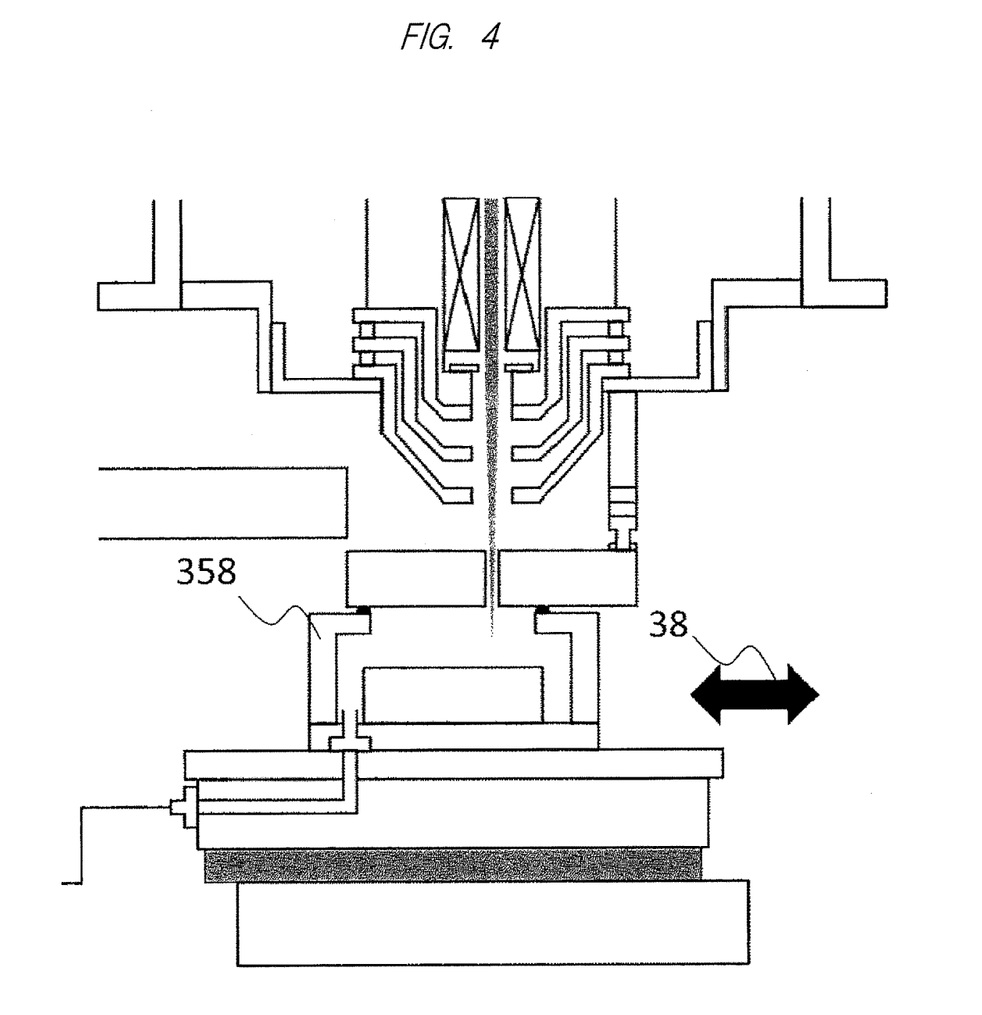
FIG. 4 is a view illustrating positional movements in the sample chamber in the ion beam device.
Figure 5:
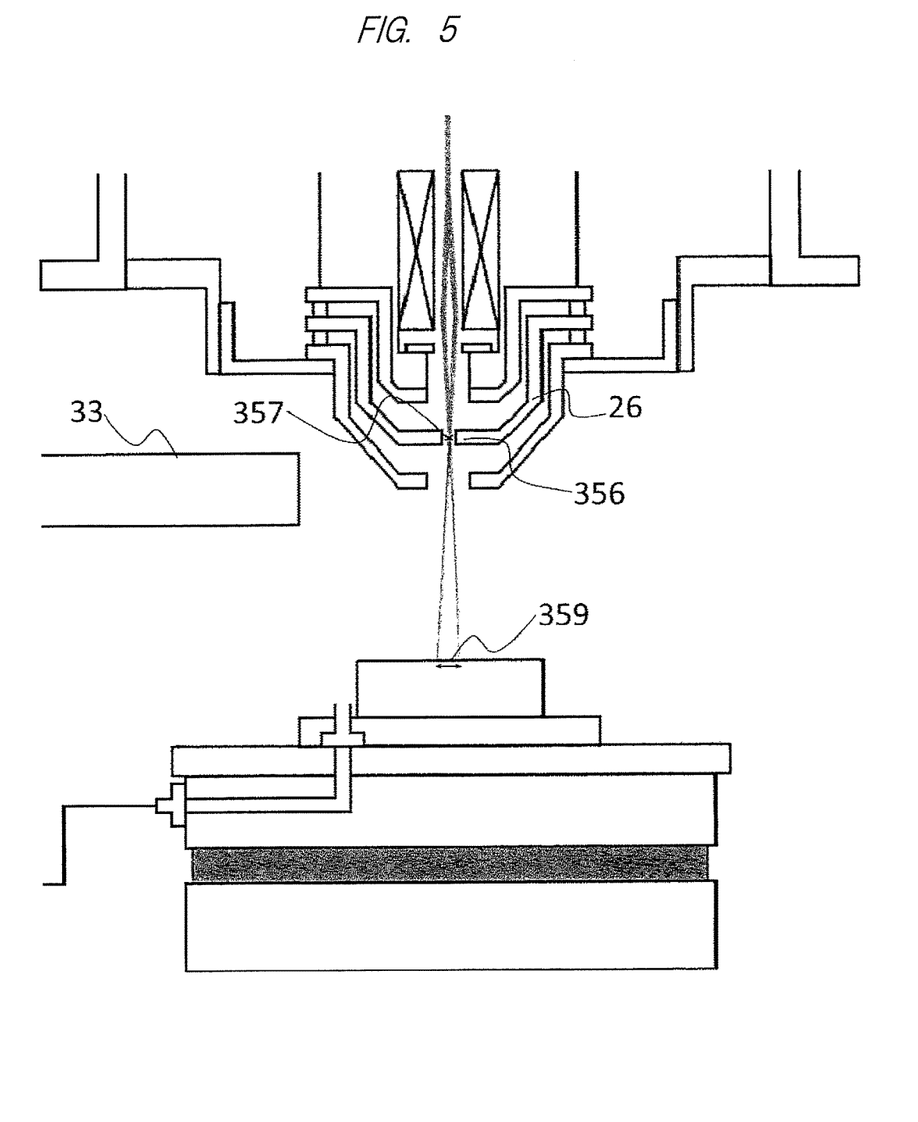
FIG. 5 is a view illustrating the vicinity of an objective lens in the ion beam device.

Referring to FIG. 3 and FIG. 4, the method of expanding the visual field of the observed image, with the diameter of the differential evacuation hole being kept small, has been described; however, a method described by reference to FIG. 5 may be used. An ion beam to be deflected by the second deflector 24 has a fulcrum that hardly changes in its position at the time of deflection. When the second deflector 24 is prepared as a deflector having electrodes in upper and lower stages, the above-mentioned fulcrum may be placed not inside the second deflector, but in a lower portion thereof.

When a differential evacuation hole 356 is placed in the vicinity of a fulcrum 357 of the scanning of the ion beam, it is possible to obtain a visual field 359 of an observed image that is larger than the diameter of the differential evacuation hole 356. When the fulcrum of the ion beam scanning is placed in the vicinity of a main surface of the objective lens 26, it is possible to reduce aberration caused by a beam deflection.

In accordance with this method, a pressure of the sample chamber 3 including the secondary particle detector 33 is increased; however, a distance between the sample 31 and the secondary particle detector 33, the gaseous species to be introduced into the sample chamber 3, or the like may be configured so as to amplify an amount of electrons detected by, for example, collisions of secondary electrons discharged from the sample 31 by the ion beam irradiation with gas molecules in a passage from a discharging point on the sample surface to the secondary particle detector 33, for example.

The secondary particles discharged from the sample are detected by the secondary particle detector 33; however, the secondary particles might collide with the partition wall 351 and a side wall of the differential evacuation hole 352 prior to the detection, whereby the detection might be interrupted. In order to prevent this and desirably keep a detection efficiency of the secondary particles, a configuration may be provided in which an electric field or a magnetic field is generated on the periphery of the sample 31, the partition wall 351, or the differential evacuation hole 352.

Figure 6:
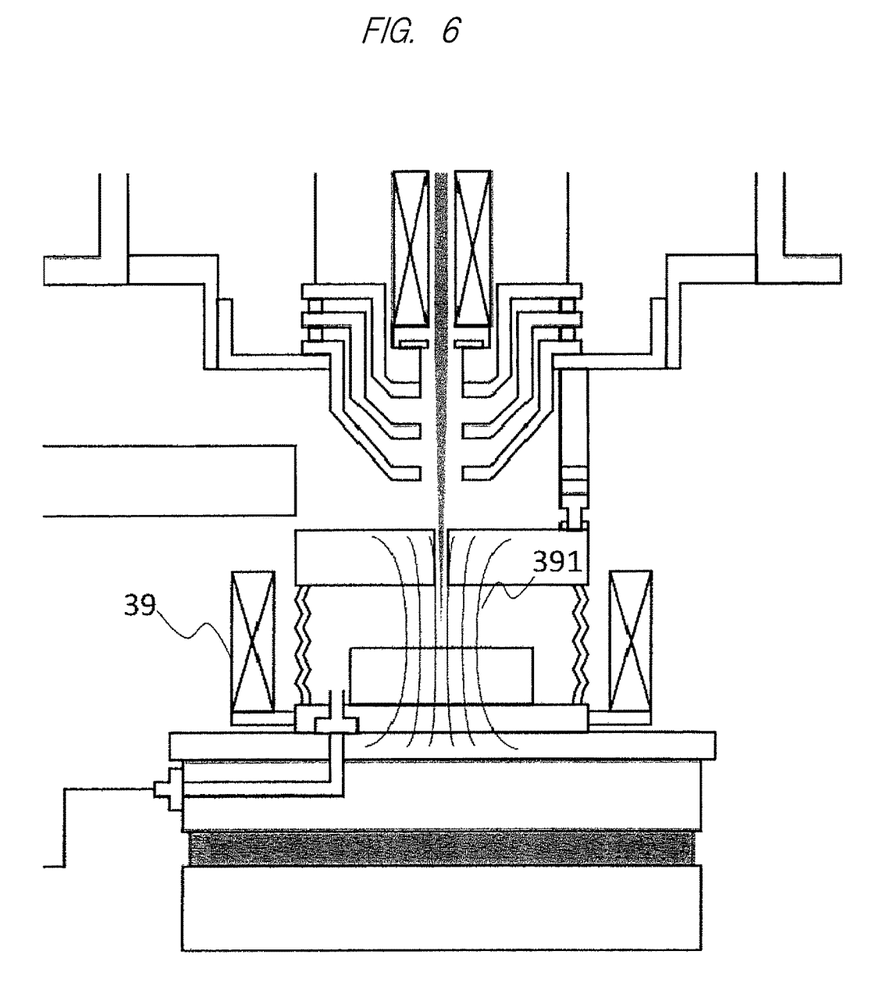
FIG. 6 is a view illustrating an example in which an electromagnetic field is applied in the vicinity of the sample chamber in the ion beam device.

For example, as shown in FIG. 6, when an electromagnetic coil 39 is disposed on the side wall of the container 35 and a magnetic field is generated so as to align lines of magnetic force 391 horizontally relative to the hole direction of the differential evacuation hole, secondary electrons assumed to be secondary particles rise upward in such a way as to wind around the lines of magnetic force, so that it becomes possible to reduce an amount of secondary electrons that collide with the side wall of the differential evacuation hole. Moreover, it may be configured such that a voltage can be applied to the sample stage 32 in an auxiliary manner, and an electric field may be generated in the vicinity of the sample 31.

EXPLANATION OF REFERENCE CHARACTERS

1 . . . gas field ionization ion source, 11 . . . emitter tip, 12 . . . opening through which ions pass, 13 . . . extraction electrode, 14 . . . ionization chamber outer wall, 15 . . . ion beam, 16 . . . ion source vacuum evacuation pump, 17 . . . ionization chamber, 2 . . . beam irradiation system column, 21 . . . converging lens, 22 . . . aperture, 23 . . . first deflector, 24 . . . second deflector, 26 . . . objective lens, 27 . . . vacuum pump, 3 . . . sample chamber, 31 . . . sample, 32 . . . sample stage, 33 . . . secondary particle detector, 34 . . . vacuum pump, 35 . . . vacuum container, 351 . . . partition wall, 352 . . . differential evacuation hole, 353 . . . connection hole, 354 . . . partition wall fixing mechanism, 355 . . . movable member, 356 . . . differential evacuation hole, 357 . . . fulcrum of ion beam scanning, 358 . . . vacuum sealing surface, 359 . . . visual field of an observed image, 36 . . . sample preparation chamber, 361 . . . gate valve, 362 . . . linear introducing machine, 37 . . . gas introducing mechanism, 371 . . . gas cylinder, 372 . . . gas line, 373 . . . valve, 374 . . . flow rate adjusting unit, 38 . . . scanning, 39 . . . electromagnetic coil, 391 . . . lines of magnetic force, 4 . . . cooling mechanism, 41 . . . cooler main body, 411 . . . compressor unit, 42 . . . tube for a cooler, 43 . . . gas line, 431 . . . gas cylinder, 432 . . . vacuum pump, 433 . . . valve, 434 . . . flow rate adjusting unit, 44 . . . gas line, 441 . . . gas cylinder, 443 . . . valve, 6 . . . device mounting base, 61 . . . antivibration mechanism, 62 . . . base plate

The invention claimed is:

1. An ion beam device comprising:
   an ion source configured to generate an ion beam;
   a sample chamber;
   an evacuation pump configured to reduce a pressure in the sample chamber to a first degree of vacuum; and
   a vacuum container configured to hold a sample that is irradiated with the ion beam,
   wherein the ion beam passes from the sample chamber to the sample through a passage in the vacuum container in which the first degree of vacuum changes to a second degree of vacuum lower than the first degree of vacuum, and the passage has an aspect ratio of 200 or more.

2. The ion beam device according to claim 1, wherein the passage has the aspect ratio of 200 to 400.

3. The ion beam device according to claim 1, further comprising:
   a sample stage on which the vacuum container is disposed and which is configured to move a relative position of the sample to the passage.

4. The ion beam device according to claim 1, wherein the ion source is a field ionization ion source.

5. The ion beam device according to claim 1, wherein a part of a partition wall of the vacuum container is constituted by a film configured to transmit an electromagnetic wave in a range of any of ultraviolet ray, visible ray, and infrared ray and a surface of the sample is optically observable from an outside of the vacuum container.

6. The ion beam device according to claim 1, further comprising:

an electromagnetic coil configured to apply a magnetic field or an electric field in a vicinity of the sample.

\* \* \* \* \*